(12) United States Patent
Fung et al.

(10) Patent No.: US 12,374,557 B2
(45) Date of Patent: Jul. 29, 2025

(54) METHODS FOR ETCHING STRUCTURES WITH OXYGEN PULSING

(71) Applicant: Applied Materials, Inc., Santa Clara, CA (US)

(72) Inventors: Nancy Fung, Livermore, CA (US); Gabriela Alva, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 465 days.

(21) Appl. No.: 17/986,693

(22) Filed: Nov. 14, 2022

(65) Prior Publication Data

US 2023/0072732 A1    Mar. 9, 2023

Related U.S. Application Data

(62) Division of application No. 17/369,781, filed on Jul. 7, 2021, now Pat. No. 11,527,414.

(60) Provisional application No. 63/067,106, filed on Aug. 18, 2020.

(51) Int. Cl.
*H01J 37/32*  (2006.01)
*H01L 21/3213*  (2006.01)

(52) U.S. Cl.
CPC .. *H01L 21/32139* (2013.01); *H01J 37/32449* (2013.01); *H01L 21/32136* (2013.01); *H01J 2237/3341* (2013.01)

(58) Field of Classification Search
CPC ......... H01L 21/32139; H01L 21/32136; H01L 21/0332; H01L 21/32051; H01L 21/67069; H01L 45/1616; H01L 21/67253; H01L 21/67248; H01L 22/20; H01J 37/32449; H01J 2237/3341; H01J 37/32935; H01J 37/3299; H01J 37/32972; H01J 37/32963; C23C 16/455; C23C 16/4412; C23C 16/18; C23C 16/4481; C23C 16/52; C23C 14/54; B05D 1/60
USPC ............ 156/345.24, 345.25, 345.26, 345.27, 156/345.28; 118/663, 665, 668, 688; 216/67, 68, 69, 70, 71
See application file for complete search history.

(56) References Cited

U.S. PATENT DOCUMENTS

| | | | |
|---|---|---|---|
| 6,287,975 | B1 | 9/2001 | DeOrnellas et al. |
| 6,784,108 | B1 | 8/2004 | Donohoe et al. |
| 6,916,746 | B1 | 7/2005 | Hudson et al. |
| 7,183,219 | B1 | 2/2007 | Hama et al. |
| 8,491,967 | B2 * | 7/2013 | Ma .................... C23C 16/45508  427/299 |
| 9,153,453 | B2 | 10/2015 | Bouet et al. |
| 10,043,684 | B1 * | 8/2018 | Arnepalli .......... H01L 21/02244 |
| 2001/0035582 | A1 | 11/2001 | Tesauro et al. |
| 2003/0189232 | A1 * | 10/2003 | Law .................. H10D 30/0316  257/E21.414 |

(Continued)

OTHER PUBLICATIONS

International Search Report dtd Nov. 2, 2021 for Application No. PCT/US2021/040728.

*Primary Examiner* — Rudy Zervigon
(74) *Attorney, Agent, or Firm* — Patterson + Sheridan, LLP

(57) ABSTRACT

A system and method for patterning a material layer on a substrate includes forming a hard mask layer on a material layer disposed on a substrate, and etching the material layer through the hard mask layer by simultaneously supplying an etching gas mixture and an oxygen containing gas. The etching gas mixture is supplied continuously and the oxygen containing gas is pulsed.

16 Claims, 4 Drawing Sheets

(56) References Cited

U.S. PATENT DOCUMENTS

| | | | |
|---|---|---|---|
| 2003/0190423 A1* | 10/2003 | Yang | C23C 16/45544 |
| | | | 427/255.28 |
| 2005/0009350 A1 | 1/2005 | Vogt | |
| 2005/0023242 A1 | 2/2005 | Nguyen et al. | |
| 2006/0019495 A1* | 1/2006 | Marcadal | C23C 16/45553 |
| | | | 257/E21.171 |
| 2009/0325381 A1* | 12/2009 | Chan | H01L 21/31105 |
| | | | 438/675 |
| 2010/0048032 A1* | 2/2010 | Sangam | C23C 16/45582 |
| | | | 438/785 |
| 2015/0099368 A1 | 4/2015 | Shen et al. | |
| 2016/0099146 A1* | 4/2016 | Saly | H01L 21/0228 |
| | | | 438/778 |
| 2017/0278864 A1 | 9/2017 | Hu et al. | |
| 2018/0337047 A1 | 11/2018 | Fung et al. | |
| 2019/0311909 A1* | 10/2019 | Bajaj | H01L 21/32135 |
| 2020/0350014 A1 | 11/2020 | Liu | |
| 2021/0249436 A1 | 8/2021 | Ding et al. | |
| 2022/0059366 A1 | 2/2022 | Fung et al. | |
| 2024/0363723 A1* | 10/2024 | Gandikota | H10D 84/85 |

\* cited by examiner

METHODS FOR ETCHING STRUCTURES WITH OXYGEN PULSING

CROSS-REFERENCE TO RELATED APPLICATIONS

This application is a divisional application of U.S. patent application Ser. No. 17/369,781, filed Jul. 7, 2021, which claims priority to U.S. Provisional Patent Application Ser. No. 63/067,106, filed on Aug. 18, 2020, each of which is incorporated by reference herein.

BACKGROUND

Field

Embodiments of the present disclosure generally relate to etching processes of structures in semiconductor applications. Particularly, embodiments of the present disclosure provide systems and methods for etching material layers while protecting mask layers used for etching the material layers.

Description of the Related Art

In integrated circuit fabrication, conductive materials and their silicide are used to form structures such as gate electrodes, interconnect lines, and contact plugs. As surface densities of devices on semiconductor substrates has increased while conductivity of interconnect lines formed in a stacked metal layer is maintained, the smallest in-plane dimension of interconnect lines (also known as critical dimensions, CD) has scaled down faster than the thickness of the stacked metal layer resulting in high aspect ratio interconnect lines.

One technique to fabricate such high aspect ratio interconnect lines is to dry etch a stacked metal layer using a hard mask. Plasma provides anisotropic etch because of highly anisotropic source of energetic ions that are accelerated toward an exposed surface of the stacked metal layer. However, a top portion of the hard mask may be eroded due to long exposure to reactive etching gases. Thus, conventionally, the top portion of the mask layer is oxidized or covered by a passivation layer to protect the top portion of the mask layer from erosion due to the exposure to reactive etching gases. However, conventionally oxidizing the top portion of the hard mask may cause an issue in etching an underlying stacked metal layer as use of oxygen containing gas to oxidize the hard mask may alter an etch rate of some metal material in the stacked metal layer relative to some other metal material in the stacked metal layer. This etch rate difference may lead to deformed profiles, height loss, or other defects in etching of a stacked metal layer, significantly impacting the critical dimension (CD) control and feature transfer to the stacked metal layer in the device structures. As a result, undesired structure profiles and inaccurate resultant dimensions render early failure of the device performance.

Therefore, there is a need for a method for performing an etching process in which a hard mask is protected without impacting the etch profile of the stacked metal layer.

SUMMARY

Embodiments of the present disclosure provide a method for patterning a material layer. The method includes forming a hard mask layer on a material layer disposed on a substrate, and etching the material layer through the hard mask layer by simultaneously supplying an etching gas mixture and an oxygen containing gas. The etching gas mixture is supplied continuously and the oxygen containing gas is pulsed.

Embodiments of the present disclosure also provide a method for etching a material layer on a substrate through a hard mask in a processing chamber. The method includes supplying an etching gas mixture to a material layer having a hard mask layer formed thereon in a processing chamber, and simultaneously supplying an oxygen containing gas to the material layer in the processing chamber. The etching gas mixture is supplied continuously and the oxygen containing gas is pulsed.

Embodiments of the present disclosure also provide a processing system. The processing system includes a processing chamber, and a controller configured to cause a process to be performed in the processing system that includes supplying an etching gas mixture to a material layer having a hard mask layer formed thereon in a processing chamber, and simultaneously supplying an oxygen containing gas to the material layer in the processing chamber, where the etching gas mixture is supplied continuously and the oxygen containing gas is pulsed.

BRIEF DESCRIPTION OF THE DRAWINGS

So that the manner in which the above recited features of the present disclosure are attained and can be understood in detail, a more particular description of the disclosure, briefly summarized above, may be had by reference to the embodiments thereof which are illustrated in the appended drawings.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Methods for patterning features with desired small dimensions in a stacked metal layer are provided. The methods utilize pulsing oxygen containing gas while continuously supplying an etching gas mixture to etch a stacked metal layer. By doing so, a hard mask formed on the stacked metal layer and used for etching is partially regrown and protected from erosion while the oxygen containing gas does not reach the stacked metal layer which would alter an etch rate for some material in the stacked metal layer. Thus, the stacked metal layer can be predominately etched with a uniform profile having proper critical dimensions.

Figure 1:
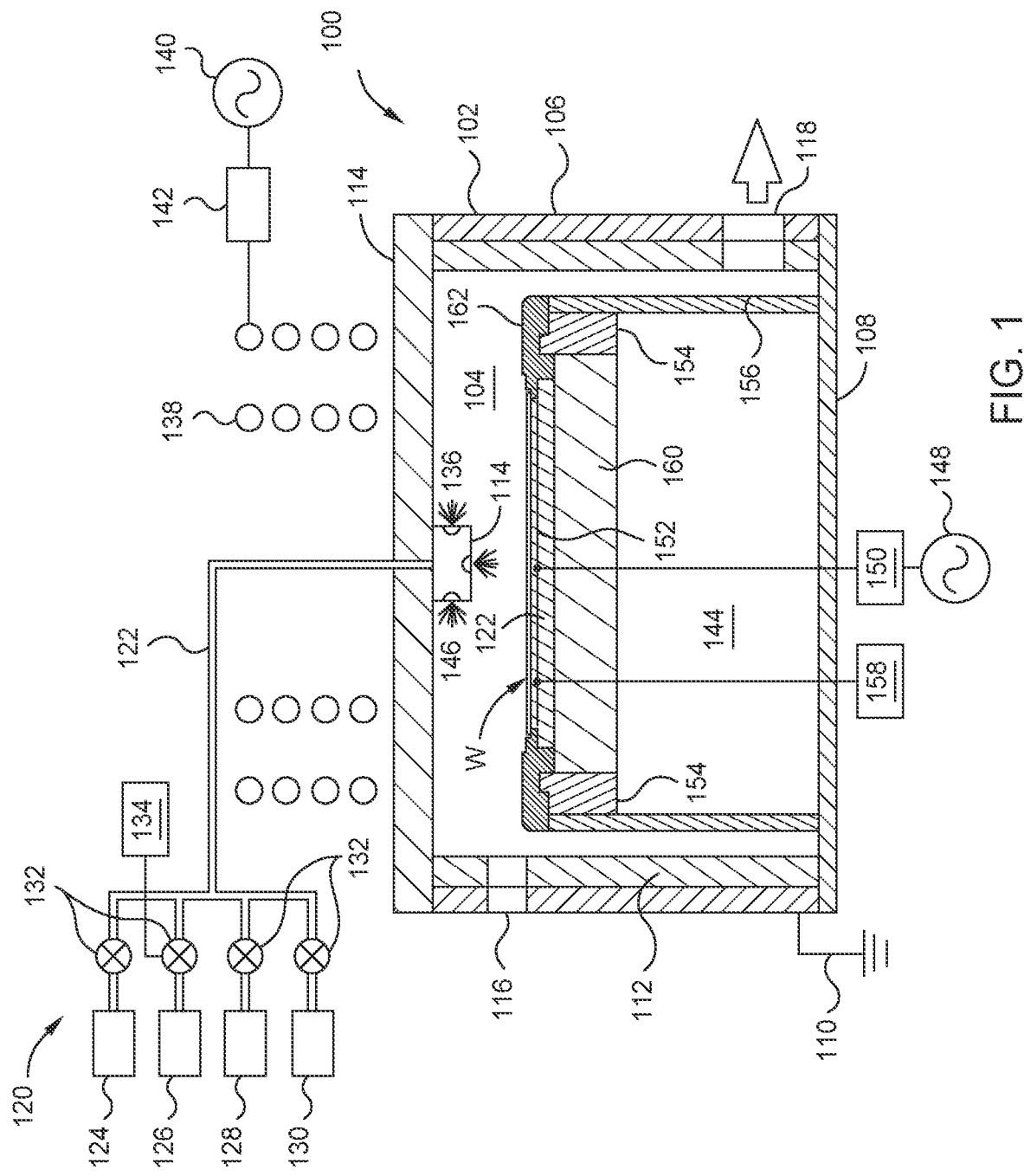
FIG. 1 is a schematic cross-sectional view of a processing chamber configured to perform a patterning process according to one or more embodiments of the disclosure.

FIG. 1 is a schematic cross-sectional view of an exemplary plasma processing chamber 100 suitable for performing a patterning process. One example of the plasma processing chamber 100 that may be adapted to benefit from the disclosure is an CENTRIS® Sym3™ etching processing chamber, available from Applied Materials, Inc., located in Santa Clara, California. It is contemplated that other process chambers, including those from other manufactures, may be adapted to practice embodiments of the disclosure.

The plasma processing chamber 100 includes a chamber body 102 having a chamber volume 104 defined therein. The chamber body 102 has sidewalls 106 and a bottom 108 which are coupled to ground 110. The sidewalls 106 have a liner 112 to protect the sidewalls 106 and extend the time between maintenance cycles of the plasma processing chamber 100. The dimensions of the chamber body 102 and related components of the plasma processing chamber 100 are not limited and generally are proportionally larger than the size of the substrate W to be processed therein. Examples of substrate sizes include 200 mm diameter, 250 mm diameter, 300 mm diameter and 450 mm diameter, among others.

The chamber body 102 supports a chamber lid assembly 114 to enclose the chamber volume 104. The chamber body 102 may be fabricated from aluminum or other suitable materials. A substrate access port 116 is formed through the sidewall 106 of the chamber body 102, facilitating the transfer of the substrate W into and out of the plasma processing chamber 100. The substrate access port 116 may be coupled to a transfer chamber and/or other chambers of a substrate processing system (not shown).

A pumping port 118 is formed through the sidewall 106 of the chamber body 102 and connected to the chamber volume 104. A pumping device (not shown) is coupled through the pumping port 118 to the chamber volume 104 to evacuate and control the pressure therein. The pumping device may include one or more pumps and throttle valves.

A gas panel 120 is coupled by a gas line 122 to the chamber body 102 to supply process gases into the chamber volume 104. The gas panel 120 may include one or more process gas sources 124, 126, 128, 130 and may additionally include inert gases, non-reactive gases, and reactive gases, if desired. Examples of process gases that may be provided by the gas panel 120 include, but are not limited to, hydrocarbon containing gas including methane ($CH_4$), sulfur hexafluoride ($SF_6$), silicon chloride ($SiCl_4$), carbon tetrafluoride ($CF_4$), hydrogen bromide (HBr), hydrocarbon containing gas, argon gas (Ar), chlorine ($Cl_2$), nitrogen ($N_2$), helium (He) and oxygen gas ($O_2$). Additionally, process gases may include nitrogen, chlorine, fluorine, oxygen and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, CO, $N_2$, $NO_2$, $N_2O$ and $H_2$ among others.

Valves 132 control the flow of the process gases from the process gas sources 124, 126, 128, 130 from the gas panel 120 and are managed by a controller 134. The flow of the gases supplied to the chamber body 102 from the gas panel 120 may include combinations of the gases.

The chamber lid assembly 114 may include a nozzle 136. The nozzle 136 has one or more ports for introducing the process gases from the process gas sources 124, 126, 128, 130 of the gas panel 120 into the chamber volume 104. After the process gases are introduced into the plasma processing chamber 100, the gases are energized to form plasma. An antenna 138, such as one or more inductor coils, may be provided adjacent to the plasma processing chamber 100. An antenna power supply 140 may power the antenna 138 through a match circuit 142 to inductively couple energy, such as RF energy, to the process gas to maintain a plasma formed from the process gas in the chamber volume 104 of the plasma processing chamber 100. Alternatively, or in addition to the antenna power supply 140, process electrodes below the substrate W and/or above the substrate W may be used to capacitively couple RF power to the process gases to maintain the plasma within the chamber volume 104. The operation of the antenna power supply 140 may be controlled by a controller, such as controller 134, that also controls the operation of other components in the plasma processing chamber 100.

A substrate support pedestal 144 is disposed in the chamber volume 104 to support the substrate W during processing. The substrate support pedestal 144 may include an electrostatic chuck (ESC) 146 for holding the substrate W during processing. The ESC 146 uses the electrostatic attraction to hold the substrate W to the substrate support pedestal 144. The ESC 146 is powered by an RF power supply 148 integrated with a match circuit 150. The ESC 146 comprises an electrode 152 embedded within a dielectric body. The electrode 152 is coupled to the RF power supply 148 and provides a bias which attracts plasma ions, formed by the process gases in the chamber volume 104, to the ESC 146 and substrate W positioned thereon. The RF power supply 148 may cycle on and off, or pulse, during processing of the substrate W. The ESC 146 has an isolator 154 for the purpose of making the sidewall of the ESC 146 less attractive to the plasma to prolong the maintenance life cycle of the ESC 146. Additionally, the substrate support pedestal 144 may have a cathode liner 156 to protect the sidewalls of the substrate support pedestal 144 from the plasma gases and to extend the time between maintenance of the plasma processing chamber 100.

Furthermore, the electrode 152 is coupled to a power source 158. The power source 158 provides a chucking voltage of about 200 volts to about 2000 volts to the electrode 152. The power source 158 may also include a system controller for controlling the operation of the electrode 152 by directing a DC current to the electrode 152 for chucking and de-chucking the substrate W.

The ESC 146 may include heaters disposed therein and connected to a power source (not shown), for heating the substrate, while a cooling base 160 supporting the ESC 146 may include conduits for circulating a heat transfer fluid to maintain a temperature of the ESC 146 and substrate W disposed thereon. The ESC 146 is configured to perform in the temperature range required by the thermal budget of the device being fabricated on the substrate W. For example, the ESC 146 may be configured to maintain the substrate W at a temperature of about 25 degrees Celsius to about 500 degrees Celsius for certain embodiments.

The cooling base 160 is provided to assist in controlling the temperature of the substrate W. To mitigate process drift and time, the temperature of the substrate W may be maintained substantially constant by the cooling base 160 throughout the time the substrate W is in the cleaning chamber. In one embodiment, the temperature of the substrate W is maintained throughout subsequent cleaning processes at about 30 to 120 degrees Celsius.

A cover ring 162 is disposed on the ESC 146 and along the periphery of the substrate support pedestal 144. The cover ring 162 is configured to confine etching gases to a desired portion of the exposed top surface of the substrate W, while shielding the top surface of the substrate support pedestal 144 from the plasma environment inside the plasma processing chamber 100. Lift pins (not shown) are selectively moved through the substrate support pedestal 144 to lift the substrate W above the substrate support pedestal 144 to facilitate access to the substrate W by a transfer robot (not shown) or other suitable transfer mechanism.

The controller 134 may be utilized to control the process sequence, regulating the gas flows from the gas panel 120 into the plasma processing chamber 100 and other process parameters. Software routines, when executed by the CPU, transform the CPU into a specific purpose computer (controller) that controls the plasma processing chamber 100 such that the processes are performed in accordance with the present disclosure. The software routines may also be stored and/or executed by a second controller (not shown) that is collocated with the plasma processing chamber 100.

Figure 2:
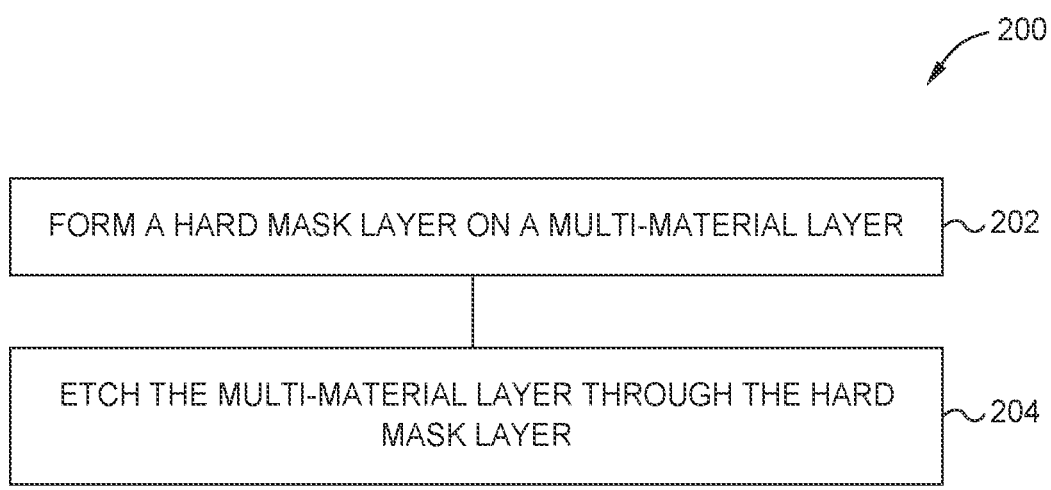
FIG. 2 is a flowchart of a method for patterning a material layer on a substrate, according to one or more embodiments of the present disclosure.
Figure 3A:
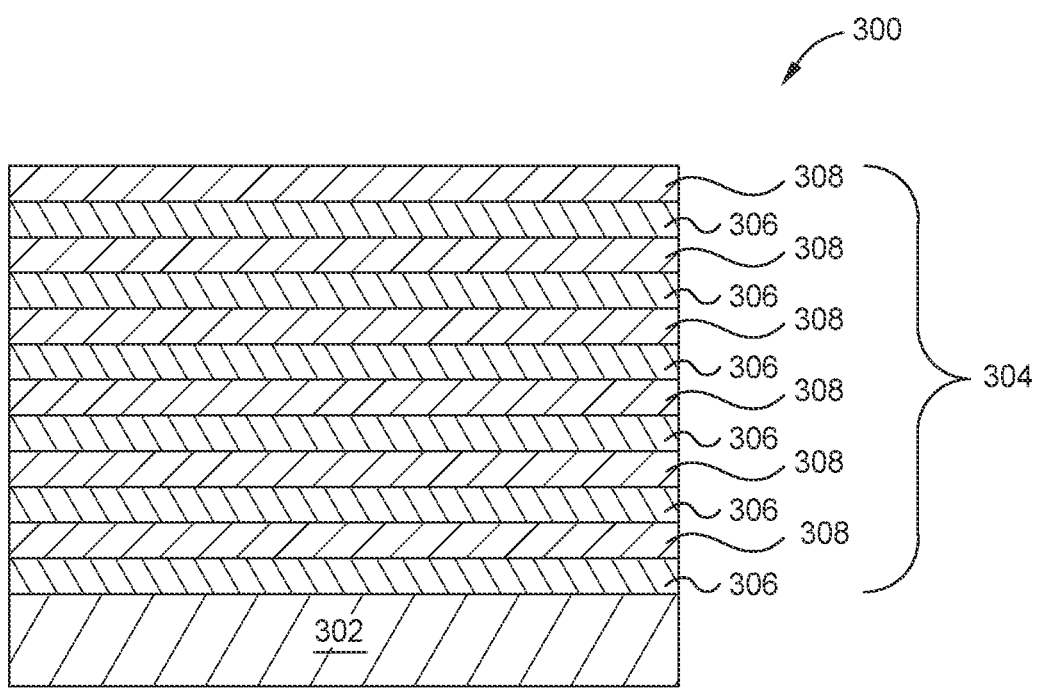
FIGS. 3A-3C illustrate cross sectional views of a structure during the patterning process of FIG. 2.
Figure 3B:
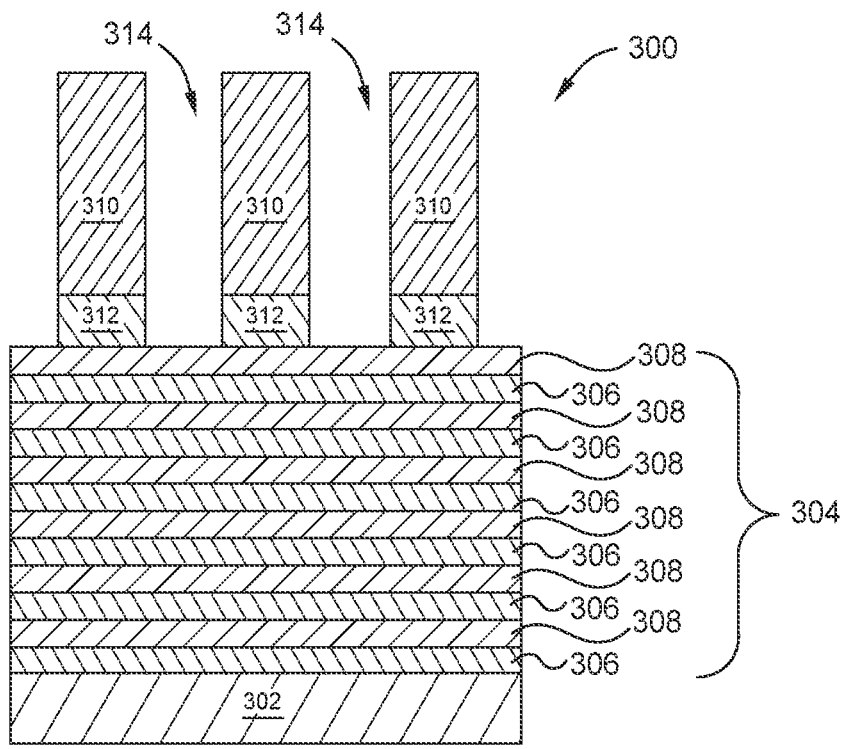
Figure 3C:
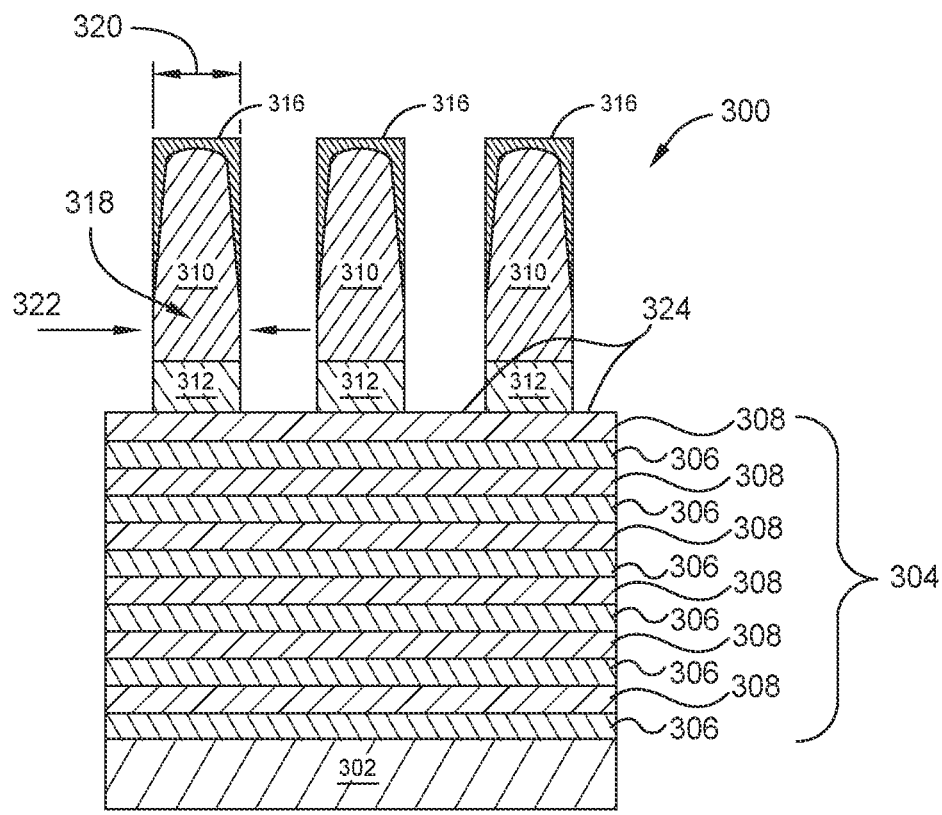

FIG. 2 is a flow diagram of a method 200 for patterning a material layer disposed on a substrate. FIGS. 3A-3C are cross-sectional views of a portion of a structure 300 formed on a substrate 302 corresponding to various stages of the method 200. The method 200 may be utilized to etch high aspect ratio features, e.g., greater than about 5:1 or about 10:1 in a material layer. Although the method 200 is described below with reference to etching a conductive material layer having a stair-like structures, the method 200 may also be used for manufacturing other types of structures.

The substrate 302 may be a silicon based material or any suitable insulating materials or conductive materials as needed. The substrate 302 may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire. The substrate 302 may have various dimensions, such as 200 mm, 300 mm, 450 mm or other diameter wafers, as well as, rectangular or square panels. Unless otherwise noted, implementations and examples described herein are conducted on substrates with a 200 mm diameter, a 300 mm diameter, or a 450 mm diameter substrate. In the implementation wherein a SOI structure is utilized for the substrate 302, the substrate 302 may include a buried dielectric layer disposed on a silicon crystalline substrate. In the example depicted herein, the substrate 302 is a crystalline silicon substrate.

The structure 300 may include a multi-material layer 304 formed of conductive material and utilized to be part of an integrated circuit, such as gate electrodes, interconnect lines, and contact plugs. In some embodiments, the multi-material layer 304 includes a number of stacked layers formed on the substrate 302 as shown in FIG. 3A. The multi-material layer 304 may include first layers 306 and second layers 308 alternately formed over the substrate 302. Although FIG. 3A shows six repeating layers of first layers 306 and second layers 308 alternately formed on the substrate 302, any desired number of repeating pairs of first layers 306 and second layers 308 may be utilized as needed.

In some examples, the multi-material layer 304 may be formed of refractory metals, such as tungsten (W), molybdenum (Mo), tantalum (Ta), titanium (Ti), hafnium (Hf), vanadium (V), chromium (Cr), manganese (Mn), ruthenium (Ru), alloys thereof, silicide compounds thereof, nitride compounds thereof, or combinations thereof. In other examples, the first layers 306 and the second layers 308 may be other metals, such as copper (Cu), nickel (Ni), cobalt (Co), iron (Fe), aluminum (Al), palladium (Pd), gold (Au), silver (Ag), platinum (Pt), alloys thereof, nitride compound thereof, or combinations thereof. In one embodiment, the first layers 306 are formed of molybdenum (Mo) and the second layers 308 are formed of tungsten (W). The multi-material layer 304 may have a total thickness of between about 200 nm and about 4500 nm. The first layers 306 may each have a thickness of between about 10 nm and about 30 nm. The second layers 308 may each have a thickness of between about 10 nm and about 30 nm.

The method 200 begins at block 202 by, prior to an etching process, forming an etch resist hard mask (referred to as a "hard mask" hereinafter) 310 on the multi-material layer 304 in a processing chamber. As shown in FIG. 3B, the structure 300 includes the hard mask layer 310 formed in a desired pattern on the multi-material layer 304. The pattern on the hard mask layer 310 may have openings 314 having a dimension of between about 1000 nm and about 1300 nm, to form features having a high aspect ratio (e.g., greater than about 5:1), and a pitch between adjacent openings 314 of between about 50 nm and about 180 nm. The structure 300 includes an adhesion layer 312 formed between the multi-material layer 304 and the hard mask layer 310. The adhesion layer 312 may function as a barrier layer between the multi-material layer 304 and the hard mask layer 310. The adhesion layer 312 may also function as a stop layer for a subsequent etch step or a chemical mechanical polishing (CMP) step.

The hard mask layer 310 may be formed of tetra-ethyl-orthosilicate (TEOS) or silicon oxynitride (SiON) and have a thickness of about 500 nm and about 2 μm. The adhesion layer 312 may be formed of any dielectric material, such as silicon nitride ($Si_3N_4$) and have a thickness of less than about 100 nm. The hard mask layer 310 and the adhesion layer 312 may be deposited by any conventional deposition process, such as a chemical vapor deposition (CVD) process, a physical vapor deposition (PVD) process, an atomic layer deposition (ALD) process, and a spin-on process, and subsequently patterned by a conventional photolithographic process using a patterned photoresist layer (not shown) covering the hard mask layer 310.

At block 204, an etching process is performed to pattern the multi-material layer 304 through the hard mask layer 310 using plasma excited species or radicals in a plasma process chamber, such as the plasma processing chamber 100 depicted in FIG. 1. The etching process at block 204 allows the multi-material layer 304 to be predominately etched while providing sufficient protection on the hard mask layer 310. The etching process may be continued until the multi-material layer 304 is etched to a predetermined depth. In some embodiments, the multi-material layer 304 is etched to a depth of between about 200 nm and about 4500 nm.

In one example, the etching process is performed by simultaneously supplying an etching gas mixture and an oxygen containing gas in the plasma processing chamber. The etching gas mixture includes an inert gas, such as helium (He) or argon (Ar), and a halogen containing gas. Suitable examples of the halogen containing gas include silicon-containing compounds, such as $SiCl_4$, $SiHCl_3$, $SiH_2Cl_2$, $SiH_3Cl$, $Si_2Cl_6$, $SiBr_4$, $SiHBr_3$, $SiH_2Br_2$, $SiH_3Br$, $SiH_4$, $Si_2H_6$, $Si_3H_8$, $Si_4H_{10}$, $SiHI_2$, $SiH_2I$, $C_4H_{12}Si$, and $Si(C_2H_3O_2)_4$. Suitable examples of the halogen containing gas also include chlorine or fluorine containing gas, such as $Cl_2$, $BCl_3$, $NF_3$, HF, $CF_4$, and $CHF_3$. Suitable examples of the oxygen containing gas include $O_2$, $NO_2$, $N_2O$, $O_3$, $SO_2$, COS, CO, and $CO_2$. In one particular example, the halogen containing gas supplied in the etching gas mixture includes $SiCl_4$, $Cl_2$, and $BCl_3$, and the oxygen containing gas includes $O_2$. Since top portions 316 of the hard mask layer 310 are regrown to form silicon oxide by the oxygen containing gas, the top portions 316 are reacted with the etching species or radicals generated in the etching gas mixture at a slower rate than the remainder 318 of the hard mask layer 310. Thus, the hard mask layer 310 may be sufficiently protected from the etching species or radicals, leaving a width 320 of the top portion 316 of the hard mask layer 310 substantially the same as a width 322 of the remainder 318 of the hard mask layer 310. However, the oxygen containing gas may also alter an etch rate of the first layers 306 relative to the second layers 308, thus affecting an etch profile in the multi-material layer 304. Thus, in the embodiments described herein, the oxygen containing gas is supplied pulsed such that the oxygen containing gas is consumed to regrow the top portions 316 of the hard mask layer 310 to form silicon oxide and does not reach an exposed surface 324 of the multi-material layer 304 With the etching gas mixture supplied continuously and the oxygen containing gas pulsed, the multi-material layer 304 may be predominately etched without impacting the etch profile of the multi-material layer 304 or substantially damaging the hard mask layer 310. As a result, etching of the multi-material layer 304 with a uniform profile having proper critical dimensions can be achieved.

The thickness of the regrown top portions 316 may be reduced along the thickness of the hard mask layer 310 as shown in FIG. 3C. In some examples, the thickness of the regrown top portions 316 at or around the middle portion of the hard mask layer 310 is reduced to zero. A ratio of the height of the regrown top portions 316 to the depth of the openings 314 (i.e., the thickness of the hard mask layer 310) may be less than about 50 nm.

During the etching process, several process parameters may also be regulated. In one exemplary embodiment, a process pressure in the plasma processing chamber 100 is regulated between about 10 mTorr and about 5000 mTorr, such as between about 20 mTorr and about 500 mTorr. The oxygen containing gas is supplied at a pulse duration of between about 1 seconds and about 10 seconds, for example, about 5 seconds. A duty cycle (i.e., a ratio of an "on" period in which the oxygen containing gas is supplied to an "off" period in which the oxygen containing gas is not supplied) may be between about 1:3 and about 3:1, for example, about 1:1. The total etching time may be between about 6 seconds and about 1800 seconds, for example, about 170 seconds depending on the total thickness of the multi-material layer 304.

An RF source and/or bias power may be utilized while performing the etching process. The RF bias power applied when supplying the etching gas mixture assists in forming the reactive etchants with desired directionality so as to travel down to the surface 326 of the multi-material layer 304 that is exposed from the hard mask layer 310 to predominately etch the multi-material layer 304. In contrast, the elimination of the RF bias power while supplying the oxygen containing gas can assist the reactive species in the plasma to be more uniformly distributed across the hard mask layer 310, close to the top portions 316 of the hard mask layer 310 so as to regrow the top portions 316 of the hard mask layer 310 to form silicon oxide. For example, an RF source power of less than about 2000 Watts may be applied to maintain a plasma inside the plasma processing chamber 100. An RF bias power of between about 1000 Watts and about 6000 Watts may be applied when the oxygen containing gas is supplied, and when the oxygen containing gas is not supplied.

The etching gas mixture may be flowed into the chamber at a rate between about 5 sccm to about 900 sccm. In one example, $SiCl_4$, $Cl_2$, and $BCl_3$ gases may be supplied at flow rates of between about 30 sccm and about 140 sccm, for example, about 100 sccm, between about 100 sccm and about 1000 sccm, for example, about 490 sccm, and less than about 300 sccm, for example, about 300 sccm, respectively. The oxygen $O_2$ gas may be supplied at a flow rate of between about 5 sccm and about 200 sccm, for example, about 10 sccm. A ratio of a flow rate of the oxygen containing gas to a flow rate of the etching gas mixture may be between about 1:20 and about 1:6, for example about 1:10.

A substrate temperature is maintained at a temperature of between about 80° C. and about 300° C., for example about 190° C.

Benefits of the present disclosure include improvement in patterning features with accurate and uniform profiles for three dimensional (3D) stacking of semiconductor chips. The methods according to the embodiments disclosed herein utilize pulsing oxygen containing gas while continuously supplying an etching gas mixture to etch a stacked metal layer. By doing so, a hard mask formed on the stacked metal layer and used for etching is partially regrown to form silicon oxide and protected from erosion while the oxygen containing gas does not reach the stacked metal layer which would alter an etch rate for some material in the stacked metal layer. Thus, the stacked metal layer can be predominately etched with a uniform profile having proper critical dimensions.

While the foregoing is directed to embodiments of the present disclosure, other and further embodiments of the disclosure may be devised without departing from the basic scope thereof, and the scope thereof is determined by the claims that follow.

We claim:

1. A processing system comprising: a processing chamber; and a controller configured to control a process to be performed in the processing chamber that includes: supplying an etching gas mixture to a material layer having a hard mask layer formed thereon in the processing chamber; and simultaneously supplying an oxygen containing gas to top portions of an opening of the hard mask layer in the processing chamber, wherein the etching gas mixture is supplied continuously and the oxygen containing gas is pulsed and does not reach an exposed surface of the material layer.

2. The processing system of claim 1, wherein the oxygen containing gas is pulsed at a pulse duration of between 1 seconds and 10 seconds and a duty cycle of between 1:3 and 3:1.

3. The processing system of claim 1, wherein the material layer comprises first layers comprising molybdenum (Mo) and second layers tungsten (W) alternately formed on a substrate.

4. The processing system of claim 1, wherein the hard mask layer comprises tetra-ethyl-orthosilicate (TEOS).

5. The processing system of claim 1, wherein:
the etching gas mixture comprises $SiCl_4$, and
the oxygen containing gas comprises $O_2$.

6. The processing system of claim 5, wherein a ratio of a flow rate of the oxygen containing gas to a flow rate of the etching gas mixture is between 1:20 and 1:6.

7. A processing system, comprising: a processing chamber; and a controller configured to control a process to be performed in the processing chamber that includes: forming a hard mask layer on a material layer disposed on a substrate; and etching the material layer through an opening of the hard mask layer by an etching gas mixture, and simultaneously forming oxide top portions within the opening of the hard mask layer by supplying an oxygen containing gas, wherein the etching gas mixture is supplied continuously and the oxygen containing gas is pulsed and does not reach an exposed surface of the material layer.

8. The processing system of claim 7, wherein the oxygen containing gas is pulsed at a pulse duration of between 1 seconds and 10 seconds and a duty cycle of between 1:3 and 3:1.

9. The processing system of claim 7, wherein the material layer comprises first layers and second layers alternately formed on the substrate.

10. The processing system of claim 9, wherein the first layers comprises molybdenum (Mo) and the second layers comprise tungsten (W).

11. The processing system of claim 9, wherein
the material layer has a thickness of between 200 nm and 4500 nm, and
the first and second layers each have a thickness of between 10 nm and 30 nm.

12. The processing system of claim 7, wherein the hard mask layer comprises tetra-ethyl-orthosilicate (TEOS).

13. The processing system of claim 7, wherein the hard mask layer has a thickness of between 500 nm and 2 μm and has openings having a dimension of between 1000 nm and 1300 nm and a pitch between adjacent openings of between 50 nm and 180 nm.

14. The processing system of claim 7, further comprising forming an adhesion layer comprising silicon nitride ($Si_3N_4$) between the material layer and the hard mask layer.

15. The processing system of claim 7, wherein
the etching gas mixture comprises $SiCl_4$, and
the oxygen containing gas comprises $O_2$.

16. The processing system of claim 15, wherein a ratio of a flow rate of the oxygen containing gas to a flow rate of the etching gas mixture is between 1:20 and 1:6.

\* \* \* \* \*